United States Patent
Xiao

(10) Patent No.: US 9,825,133 B2
(45) Date of Patent: Nov. 21, 2017

(54) SEMICONDUCTOR DEVICE AND RELATED MANUFACTURING METHOD

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/067,741

(22) Filed: Mar. 11, 2016

(65) Prior Publication Data

US 2016/0372553 A1 Dec. 22, 2016

(30) Foreign Application Priority Data

Jun. 17, 2015 (CN) .......................... 2015 1 0336342

(51) Int. Cl.
- *H01L 23/535* (2006.01)
- *H01L 29/10* (2006.01)
- *H01L 29/06* (2006.01)
- *H01L 29/24* (2006.01)
- *H01L 29/775* (2006.01)
- *H01L 29/78* (2006.01)

(52) U.S. Cl.
CPC ...... *H01L 29/1054* (2013.01); *H01L 29/0649* (2013.01); *H01L 29/24* (2013.01); *H01L 29/775* (2013.01); *H01L 29/785* (2013.01); *H01L 2029/7857* (2013.01)

(58) Field of Classification Search
CPC ......... H01L 29/78696; H01L 21/26586; H01L 23/5283; H01L 27/088; H01L 27/11573; H01L 27/11575; H01L 27/11582; H01L 29/0649; H01L 29/0657; H01L 29/083; H01L 29/0834; H01L 29/0847; H01L 29/1054
USPC .. 257/E21.409, E29.042, 104, 105, 29, 314; 438/308
See application file for complete search history.

(56) References Cited

U.S. PATENT DOCUMENTS

| 8,878,234 B2 * | 11/2014 | Gossner | ............... H01L 29/083 257/104 |
| 2008/0020537 A1 * | 1/2008 | Kim | .................. H01L 29/78696 438/308 |

(Continued)

OTHER PUBLICATIONS

Wei Liu, et al., "High-performance few-layer-MoS2 field-effect-transistor with record low contact-resistance", Electron Devices Meeting (IEDM), 2013 IEEE International, Issue Date: Dec. 9-11, 2013, 9 pages.

(Continued)

*Primary Examiner* — Edward Chin
(74) *Attorney, Agent, or Firm* — Innovation Counsel LLP

(57) ABSTRACT

A semiconductor device may include a gate electrode, an insulating layer, a first channel member, and a second channel member. The insulating layer may overlap the gate electrode. The first channel member may be positioned between the gate electrode and the insulating layer. The second channel member may be positioned between the gate electrode and the first channel member. A semiconductor material of the second channel member may be different from a semiconductor material of the first channel member.

20 Claims, 10 Drawing Sheets

(56) References Cited

U.S. PATENT DOCUMENTS

2014/0183453 A1* 7/2014 Kim .................. H01L 29/151
                                                    257/29
2016/0027796 A1* 1/2016 Yang ............... H01L 27/11573
                                                    257/314
2017/0040418 A1* 2/2017 Chen ............... H01L 29/78696

OTHER PUBLICATIONS

H. Wang et al., "Large-scale 2D Electronics based on single-layer MoS2 grown by chemical vapor deposition", Electron Devices Meeting (IEDM) 2012 IEEE International, Issue Date: Dec. 10-13, 2012, 7 pages.

* cited by examiner

SEMICONDUCTOR DEVICE AND RELATED MANUFACTURING METHOD

CROSS-REFERENCE TO RELATED APPLICATION

This application claims priority to and benefit of Chinese Patent Application No. 201510336342.5, filed on 17 Jun. 2015; the Chinese Patent Application is incorporated herein by reference in its entirety.

BACKGROUND

The technical field is related to a semiconductor device and a method for manufacturing the semiconductor device.

In semiconductor devices with substantially small sizes, short-channel effects may negatively affect performance of the semiconductor devices. Semiconductor devices may be implemented with fin structures for mitigating short-channel effects. Nevertheless, if a fin structure of a semiconductor device includes one or more substantially thick semiconductor layers, significant short-channel effects and/or significant power dissipation may still undesirably affect performance of the semiconductor device.

SUMMARY

An embodiment may be related to a semiconductor device. The semiconductor device may include a gate electrode, an insulating layer, a first channel member, and a second channel member. The insulating layer may overlap the gate electrode. The first channel member may be positioned between the gate electrode and the insulating layer. The second channel member may be positioned between the gate electrode and the first channel member. A semiconductor material of the second channel member may be different from a semiconductor material of the first channel member.

The second channel member may include at least one of a transition metal dichalcogenide layer, a silylene layer, and a black phosphorus layer.

A minimum thickness of the second channel member may be less than a minimum thickness of the first channel member.

A minimum thickness of the second channel member may be in a range of 2 nm to 10 nm.

The second channel member may include a first portion and a second portion. The first channel member may be positioned between the first portion and the second portion.

The gate electrode may include a first section and a second section. The first portion may be positioned between the first section and the first channel member. The second portion may be positioned between the second section and the first channel member.

The second channel member may include a third portion. The first portion may be connected through the third portion to the second portion. The third portion may be oriented at an angle with respect to the first portion. The angle may be less than 180 degrees and may be greater than 0 degree.

The semiconductor device may include an oxide layer. A first portion of the oxide layer may be positioned between the gate electrode and the second channel member. The oxide layer may directly contact three sides of the second channel member. The oxide layer may directly contact three sides of the gate electrode. The semiconductor device may include a drain electrode. A second portion of the oxide layer may be positioned between the drain electrode and a portion of the second channel member.

The semiconductor device may include an oxide layer. A first portion of the oxide layer may be positioned between the first channel member and the second channel member. The oxide layer may directly contact three sides of the second channel member. The oxide layer may directly contact three sides of the first channel member. The semiconductor device may include doped drain region. A second portion of the oxide layer may be positioned between the doped drain region and a portion of the second channel member.

The semiconductor device may include a doped drain region and a drain electrode. A portion of the second channel member may be positioned between the doped drain region and the drain electrode.

The semiconductor device may include a doped drain region. The doped drain region may be positioned between a portion of the first channel member and a portion of the second channel member in a direction perpendicular to the insulating layer. The semiconductor device may include a semiconductor substrate. The insulating layer may be positioned between the first channel member and the semiconductor substrate. The portion of the first channel member may be positioned between the doped drain region and the insulating layer.

The second channel member may directly contact the first channel member. The second channel member may directly contact three sides of the first channel member. A side of the insulating layer may directly contact both the first channel member and the second channel member.

An embodiment may be related to an electronic device. The electronic device may include an electronic component and a semiconductor device. The semiconductor device may be electrically connected to the electronic component and may have one or more of the aforementioned features.

According to embodiments, the second channel member of a semiconductor device may be substantially thin. Therefore, short-channel effects and/or power dissipation in the semiconductor device may be minimized. According to embodiments, a size of a band gap associated with the second channel member may be tuned (or optimized), for example, by optimizing the number of layers in the second channel member and/or using a transverse electric field. Therefore, the switching efficiency of the semiconductor device (e.g., as a transistor) may be optimized. According to embodiments, an oxide layer may optimize one or more Schottky barriers between the second channel member and one or more of the source electrode, the drain electrode, and the gate electrode of the semiconductor device. Therefore, contact resistance in the semiconductor device may be optimized. Advantageously, the size of the semiconductor device may be minimized, and/or satisfactory performance of the semiconductor device may be attained.

The above summary is related to some of many embodiments disclosed herein and is not intended to limit the scope of embodiments.

BRIEF DESCRIPTION OF THE DRAWINGS

FIG. 8A and FIG. 8B show schematic diagrams (e.g., schematic cross-sectional views) that illustrate elements and/or structures in a semiconductor device in accordance with one or more embodiments.

DETAILED DESCRIPTION

Figure 1:
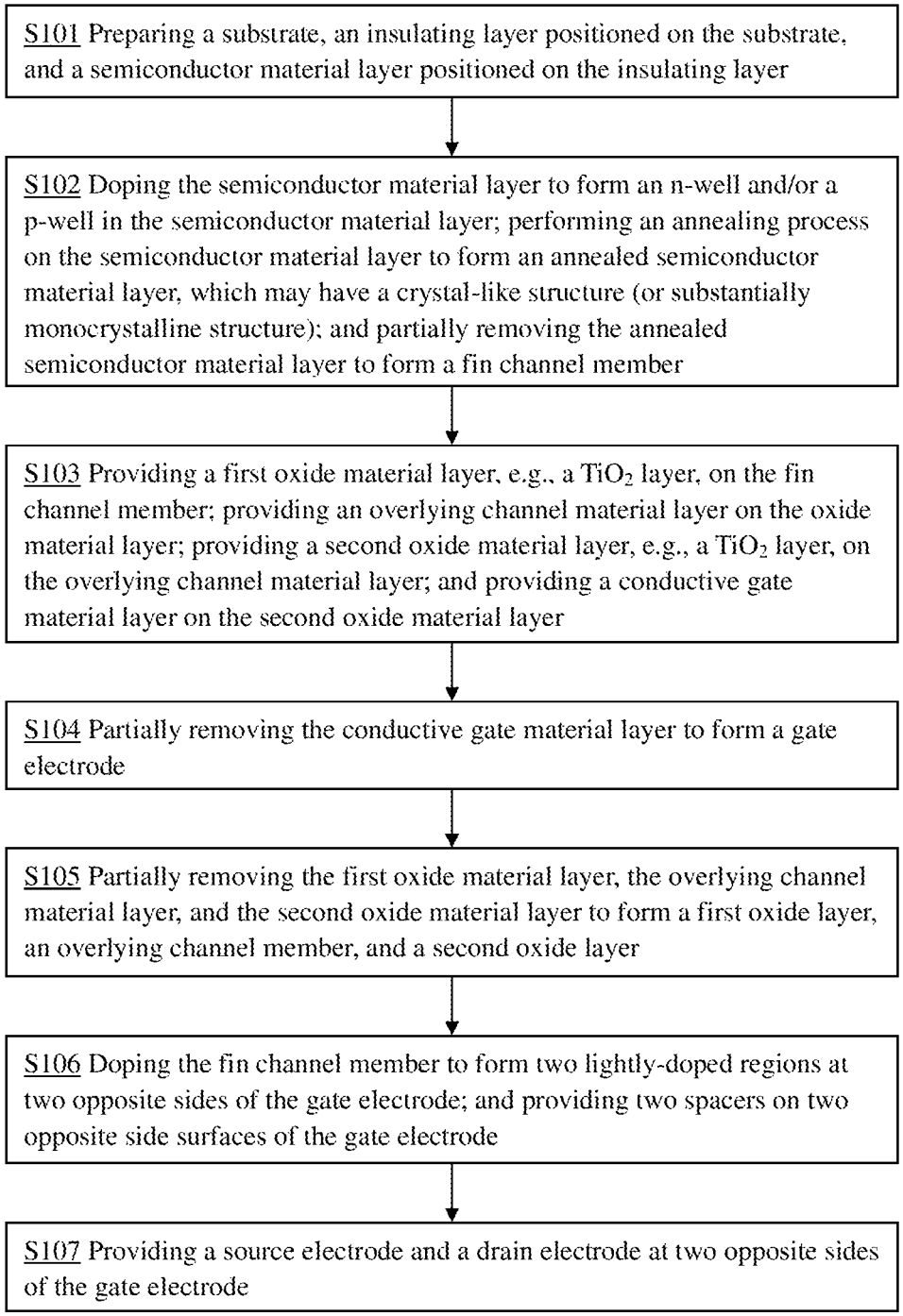
FIG. 1 shows a flowchart that illustrates steps in a method for manufacturing a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 8A:
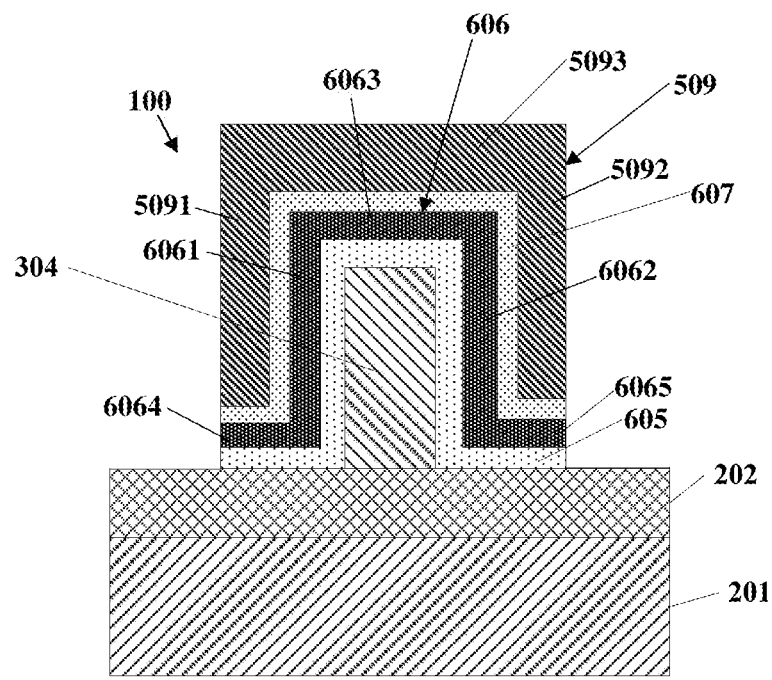
Figure 8B:
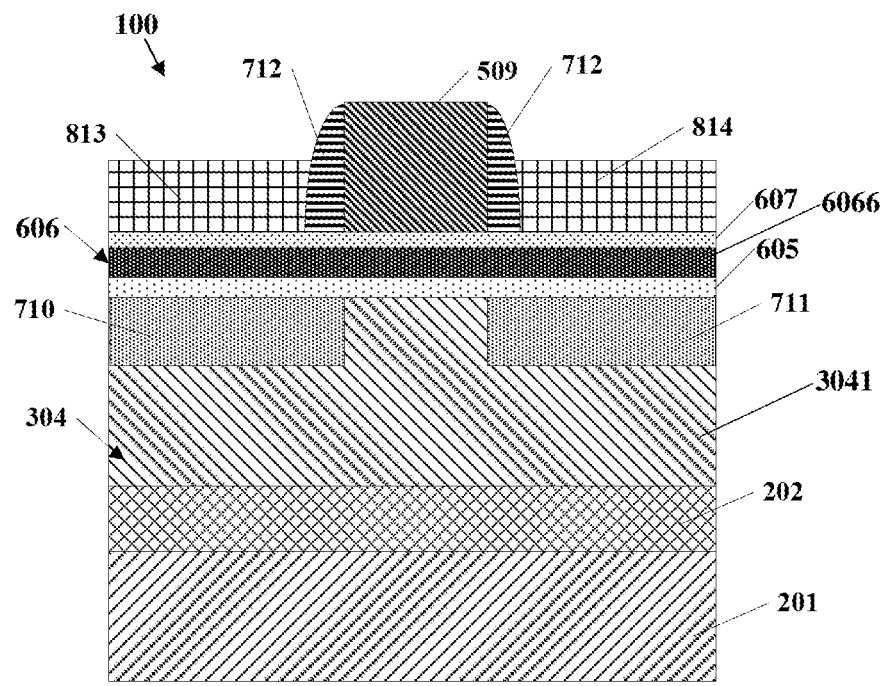
Figure 9:
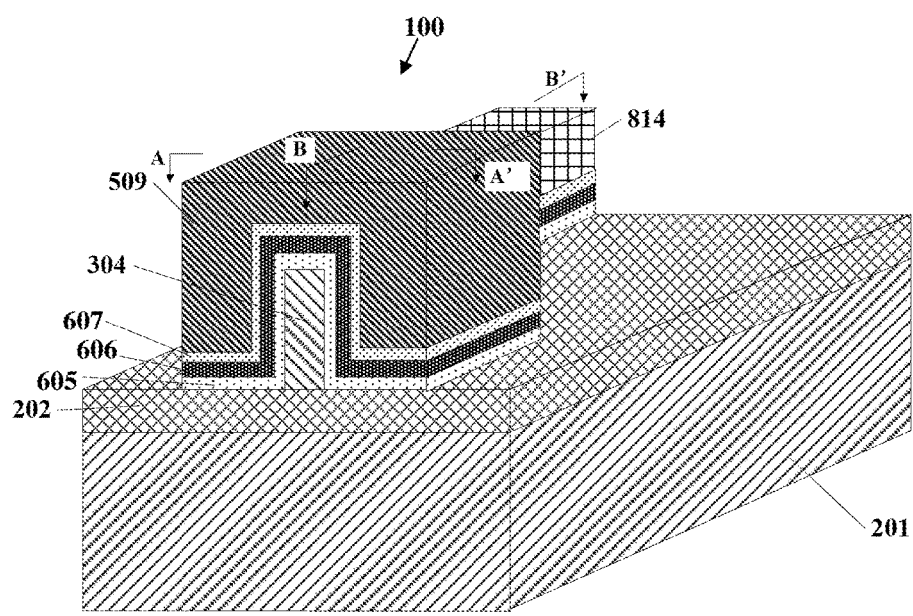
FIG. 9 shows a schematic diagram (e.g., a schematic perspective view) that illustrates elements and/or structures in a semiconductor device in accordance with one or more embodiments.

FIG. 1 shows a flowchart that illustrates steps in a method for manufacturing a semiconductor device 100 illustrated in FIG. 9 in accordance with one or more embodiments. The semiconductor device 100 may be or may include a transistor. FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, and FIG. 8B show schematic diagrams (e.g., schematic cross-sectional views) that illustrate elements and/or structures formed in a method for manufacturing the semiconductor device 100 in accordance with one or more embodiments. FIG. 8A and FIG. 8B show schematic diagrams (e.g., schematic cross-sectional views) that illustrate elements and/or structures in the semiconductor device 100 in accordance with one or more embodiments. FIG. 9 shows a schematic diagram (e.g., a schematic perspective view) that illustrates elements and/or structures in the semiconductor device 100 in accordance with one or more embodiments.

FIG. 2A, FIG. 3A, FIG. 4A, FIG. 5A, FIG. 6A, FIG. 7A, and FIG. 8A may show schematic cross-sectional views taken along a plane indicated by a line AA' indicated in FIG. 9 in accordance with one or more embodiments. FIG. 2B, FIG. 3B, FIG. 4B, FIG. 5B, FIG. 6B, FIG. 7B, and FIG. 8B may show schematic cross-sectional views taken along a plane indicated by a line BB' indicated in FIG. 9 in accordance with one or more embodiments.

Referring to FIG. 1, the method may include steps S101, S102, S103, S104, S105, S106, and S107. Sequences of some of the steps may be changed in some embodiments.

Figure 2A:
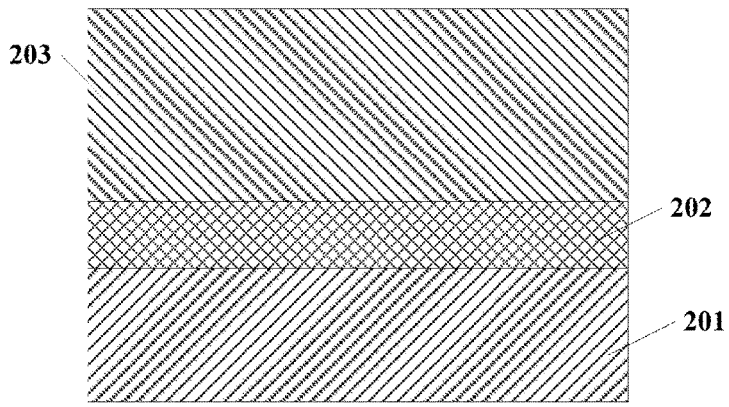
FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, and FIG. 8B show schematic diagrams (e.g., schematic cross-sectional views) that illustrate elements and/or structures formed in a method for manufacturing a semiconductor device in accordance with one or more embodiments.
Figure 2B:
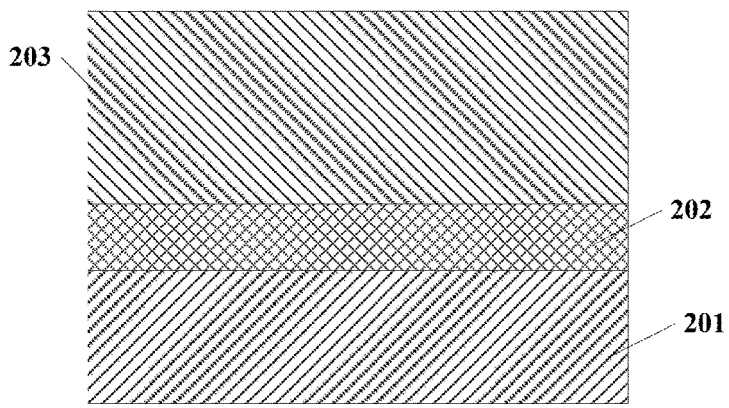
Figure 3A:
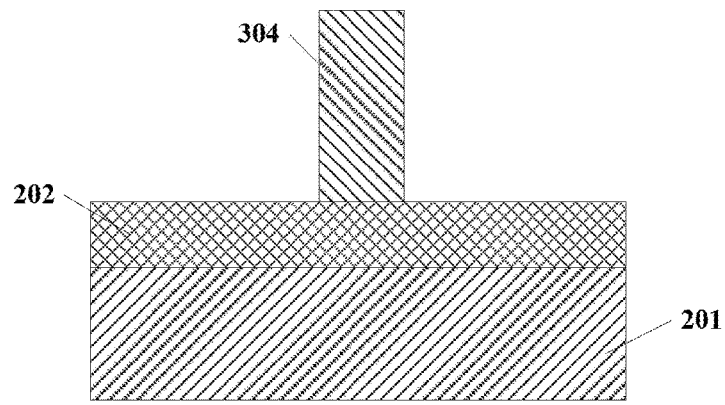
Figure 3B:
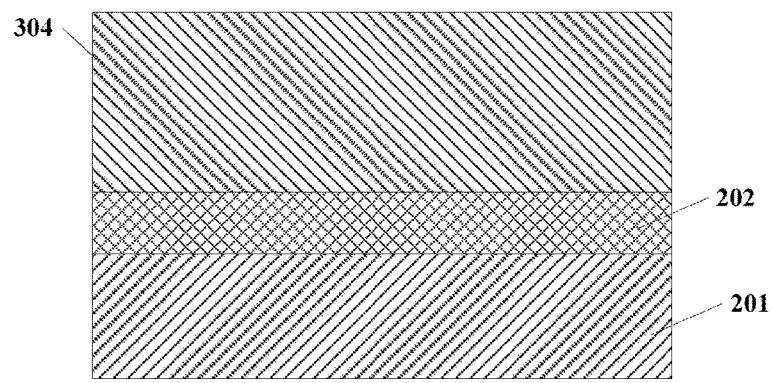
Figure 4A:
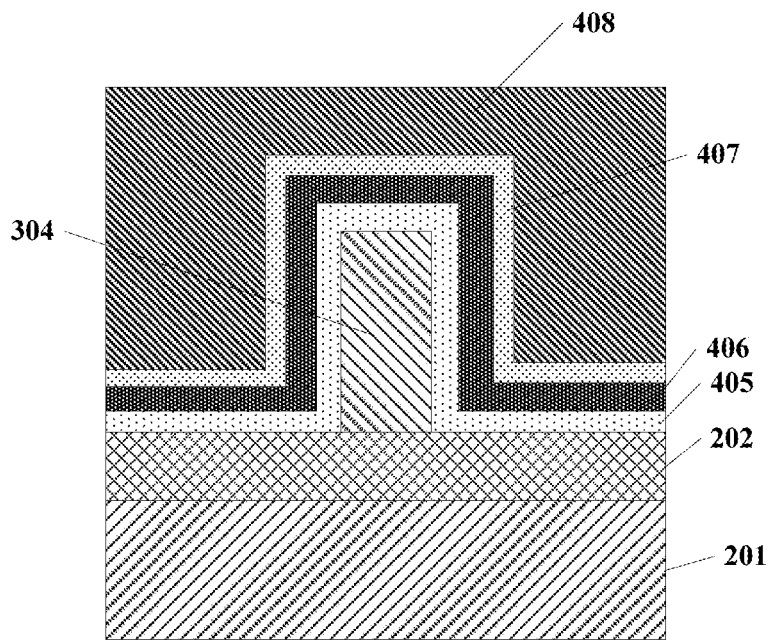
Figure 4B:
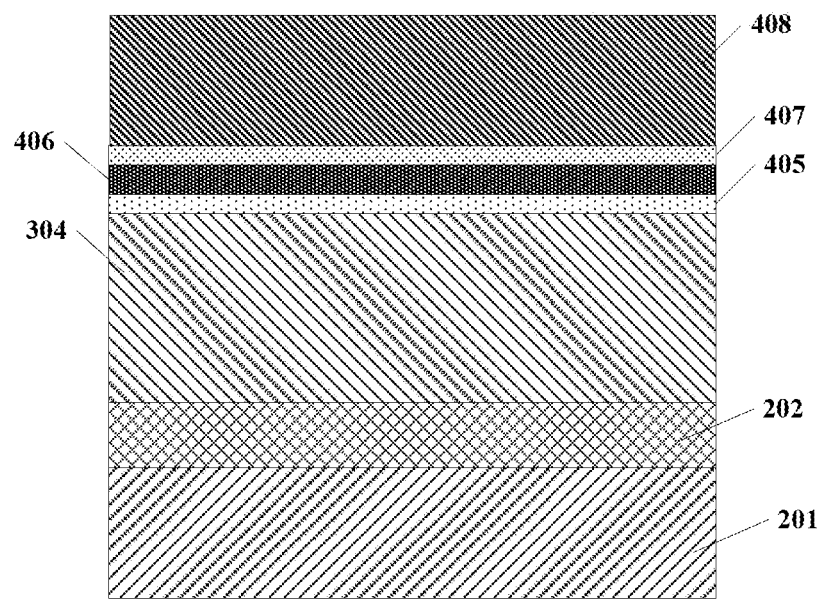
Figure 5A:
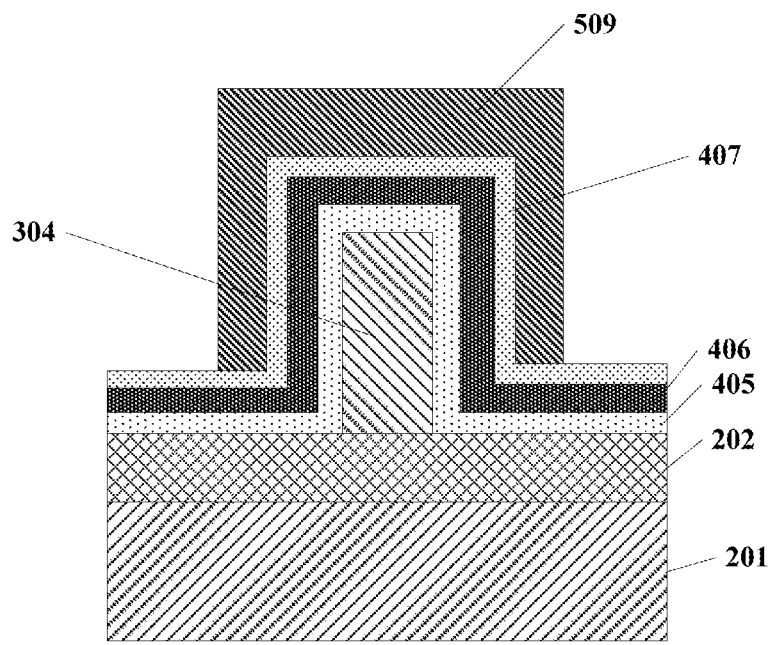
Figure 5B:
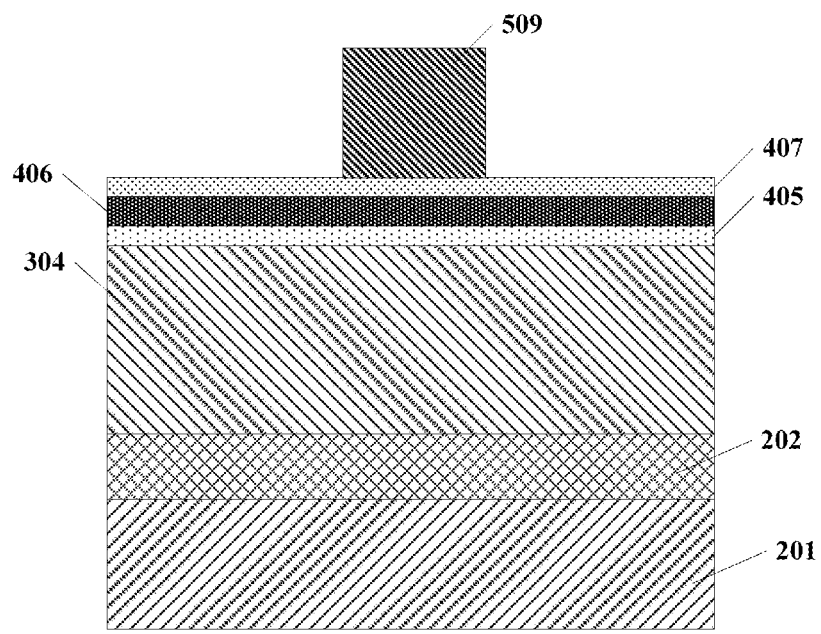
Figure 6A:
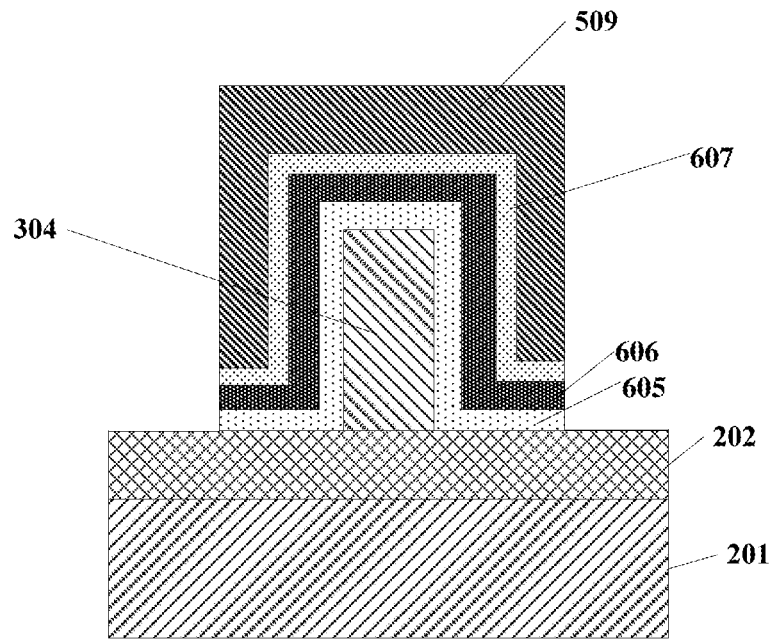
Figure 6B:
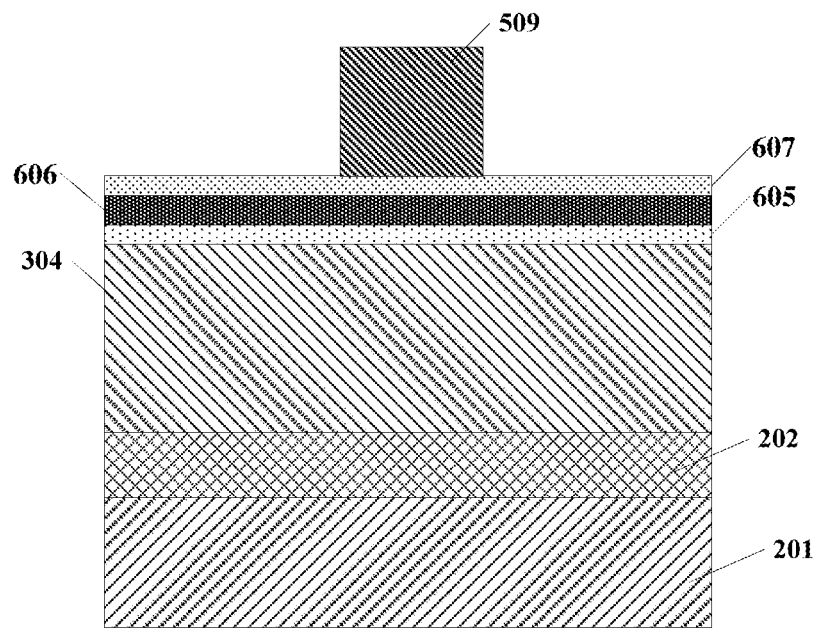

Referring to FIG. 1, FIG. 2A, and FIG. 2B, the step S101 may include preparing a substrate 201, an insulating layer 202 positioned on the substrate 201, and a semiconductor material layer 203 positioned on the insulating layer 202.

The substrate 201 may be or may include at least one of a monocrystalline silicon (mono-Si) substrate layer, a polycrystalline silicon (poly-Si) substrate layer, a silicon-on-insulator (SOI) substrate layer, a stacked silicon-on-insulator (SSOI) substrate layer, a stacked silicon-germanium-on-insulator (S—SiGeOI) substrate layer, a silicon-germanium-on-insulator (SiGeOI) substrate layer, a germanium-on-insulator (GeOI) substrate layer, a germanium (Ge) layer, and a III-V compound semiconductor substrate layer.

The insulating layer 202 may be or may include at least an oxide layer, such as at least one of a berried oxide layer and a silicon dioxide ($SiO_2$) layer. The insulating layer 202 may be form through, for example, a deposition process. A thickness of the insulating layer 202 may be in a range of 2 nm to 10 nm, such as 3 nm, 5 nm, or 8 nm.

The semiconductor material layer 203 may be formed of or may include at least one of silicon, germanium, silicon-germanium, and a III-V compound semiconductor material. The semiconductor material layer 203 may have a polycrystalline structure. The semiconductor material layer 203 may be formed through, for example, a chemical vapor deposition (CVD) process. A thickness of the semiconductor material layer 203 may be in a range of 5 nm to 50 nm.

Referring to FIG. 1, FIG. 2A, FIG. 2B, FIG. 3A, and FIG. 3B, the step S102 may include the following sub-steps: doping (e.g., using one or more ion implantation processes) the semiconductor material layer 203 to form an n-well and/or a p-well in the semiconductor material layer 203; performing an annealing process (e.g. a laser annealing process) on the semiconductor material layer 203 to form an annealed semiconductor material layer, which may have a crystal-like structure (or substantially monocrystalline structure); and partially removing (e.g., using a lithography process, a dry etching process, and/or a wet etching process) the annealed semiconductor material layer to form a fin channel member 304 (or first channel member 304). A thickness (or height) of the fin channel member 304 in a direction perpendicular to the bottom surface of the substrate 201 may be in a range of 5 nm to 50 nm.

Referring to FIG. 1, FIG. 3A, FIG. 3B, FIG. 4A, and FIG. 4B, the step S103 may include the following sub-steps: providing an oxide material layer 405, e.g., a titanium dioxide ($TiO_2$) layer or a silicon dioxide ($SiO_2$) layer, on the fin channel member 304; providing an overlying channel material layer 406 on the oxide material layer 405; providing an oxide material layer 407, e.g., a titanium dioxide ($TiO_2$) layer or a silicon dioxide ($SiO_2$) layer, on the overlying channel material layer 406; and providing a conductive gate material layer 408 on the oxide material layer 407.

Each of the oxide material layer 405 and the oxide material layer 407 may be formed through at least one deposition process, e.g., at least one of a metal organic chemical vapor deposition (MOCVD) process, an atomic layer deposition (ALD) process, etc. Each of a minimum thickness of the oxide material layer 405 and a minimum thickness of the oxide material layer 407 may be in a range of 1 nm to 2 nm, e.g., 1.5 nm.

In an embodiment, the oxide material layer 407 may not be provided. The overlying channel material layer 406 may directly contact the fin channel member 304.

The overlying channel material layer 406 may include one or more semiconductor layers. The overlying channel material layer 406 may be or may include at least one of a transition metal dichalcogenide (TMD or TMDC) layer, a silylene layer, a black phosphorus layer, etc. The TMD layer may include at least one of an $MoS_2$ layer, an $MoSe_2$ layer, an $MoTe_2$ layer, a $WS_2$ layer, a $WSe_2$ layer, a $WTe_2$ layer, etc. The overlying channel material layer 406 may be formed through one or more deposition processes, e.g., one or more chemical vapor deposition (CVD) process. The formation of the $MoS_2$ layer of the overlying channel material layer 406 may include the following steps: using S and $MoO_3$ as precursors; using PTAS (perylene-3,4,9,10-tetracarboxylic acid tetrapotassium salt) as a seed; and performing a CVD process at 650 degrees Celsius in an argon (Ar) environment to form the $MoS_2$ layer. A minimum thickness of the overlying channel material layer 406 may be in a range of 2 nm to 10 nm, e.g., 3 nm, 5 nm, or 8 nm.

The conductive gate material layer 408 may be formed of a metal material (e.g., Cr and/or Au) and/or a polycrystalline silicon material. The conductive gate material layer 408 may be formed through one or more deposition processes, e.g., one or more physical vapor deposition (PVD) processes. A thickness of the conductive gate material layer 408 (e.g., a minimum thickness of conductive gate material layer 408 in a direction perpendicular to the bottom surface of the substrate 201) may be in a range of 100 nm to 300 nm.

In an embodiment, an additional oxide material layer may be provided on the oxide material layer 407 before the formation of the conductive gate material layer 408. The conductive gate material layer 408 may be formed on the additional oxide material layer.

Referring to FIG. 1, FIG. 4A, FIG. 4B, FIG. 5A, and FIG. 5B, the step S104 may include partially removing (e.g., using a lithography process, a dry etching process, and/or a wet etching process) the conductive gate material layer 408 to form a gate electrode 509.

In an embodiment, the step S104 may include doping the fin channel member 304 to form two lightly-doped regions at two sides of the gate electrode 509. The gate electrode 509 may function as a mask in the doping process. The two lightly-doped regions may function as a source region and a drain region of the semiconductor device 100. In an embodiment, lightly-doped regions may be formed in a later step instead of the step S104.

Referring to FIG. 1, FIG. 5A, FIG. 5B, FIG. 6A, and FIG. 6B, the step S105 may include partially removing the oxide material layer 407, the overlying channel material layer 406, and the oxide material layer 405 to form an oxide layer 607, an overlying channel member 606 (or second channel member 606), and an oxide layer 605. The partial removal process may involve using the gate electrode 509 as a mask. If the additional oxide material layer has been provided in the step S103, the additional oxide material layer may be partially removed to form an additional oxide layer in the step S105. The additional oxide layer and/or the oxide layer 607 may function as a gate oxide layer of the semiconductor device 100.

In an embodiment, the oxide material layer 407, the overlying channel material layer 406, and the oxide material layer 406 may be partially removed to form a first oxide layer, an overlying channel member, and a second oxide layer before formation of a conductive gate material layer. A conductive gate material layer may be formed on the second oxide layer and may be subsequently partially removed to form a gate electrode.

Referring to FIG. 1, FIG. 6A, FIG. 6B, FIG. 7A, and FIG. 7B, the step S106 may include the following sub-steps: doping the fin channel member 304 to form two n-type lightly-doped regions or two p-type lightly-doped regions at two opposite sides of the gate electrode 509; and subsequently providing two spacers 712 on two opposite side surfaces of the gate electrode 509. The gate electrode 509 may function as a mask in the doping process. The two lightly-doped regions may function as a source region 710 and a drain region 711 of the semiconductor device 100. The spacers 712 may be formed of an insulating material, such as $SiO_2$. An insulating material layer may be formed through a deposition process and may be subsequently partially removed (e.g., through an etching process) to form the spacers 712.

Referring to FIG. 1, FIG. 7A, FIG. 7B, FIG. 8A, and FIG. 8B, the step S107 may include providing a source electrode 813 and a drain electrode 814 at two opposite sides of the gate electrode 509. The source electrode 813 and the drain electrode 814 may overlap the source region 710 and the drain region 711, respectively, and may be insulated from the gate electrode 509 by the spacers 712. The source electrode 813 and the drain electrode 814 may be or may include one or more conductive layers formed of one or more conductive materials, such as one or more metal materials (e.g., Au and/or Ti) and/or one or more alloy materials (e.g., an Au—Ti alloy).

Figure 7A:
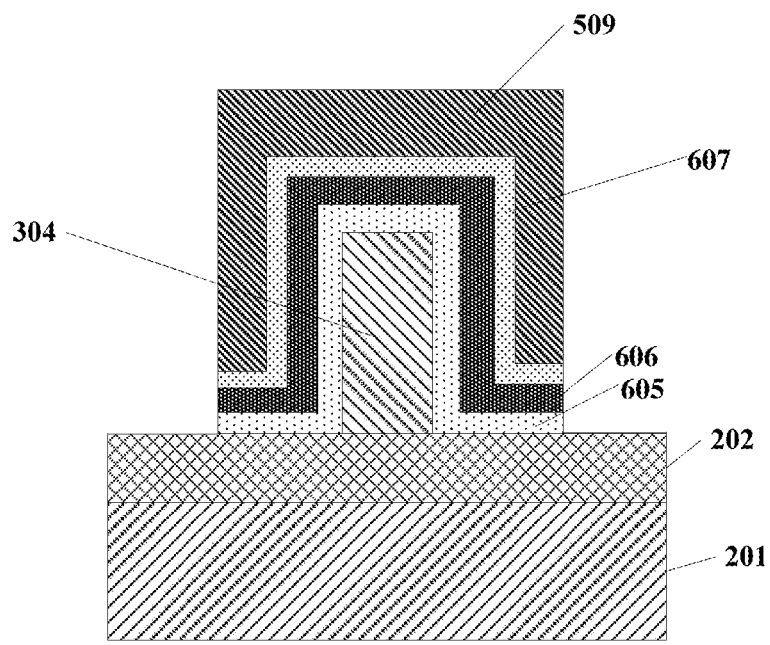
Figure 7B:
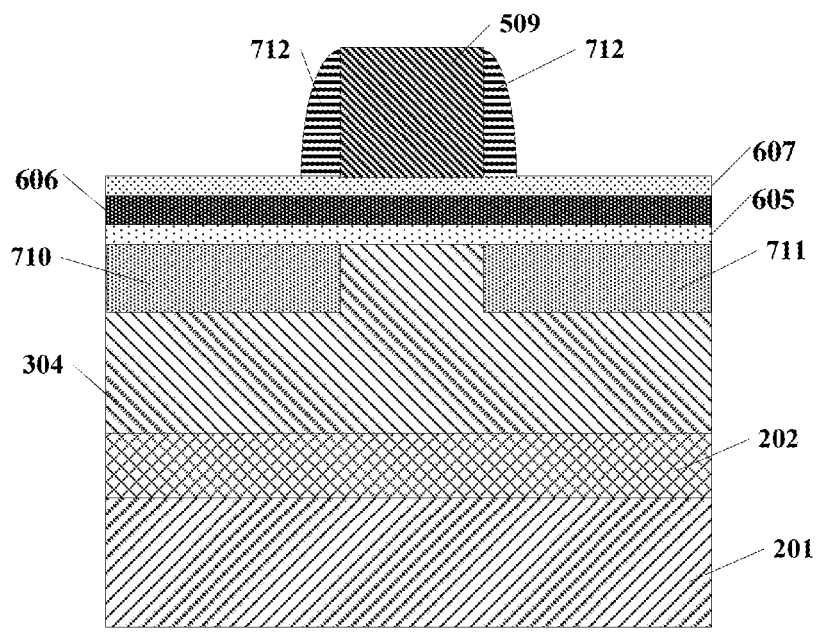

In an embodiment, a Ti layer may be formed on the structure illustrated in FIG. 7A and FIG. 7B, an Au layer may be formed on the Ti layer, and the Au layer and the Ti layer may be etched to form the source electrode 813 and the drain electrode 814. A thickness of the Ti layer may be about 50 nm. A thickness of the Au layer may be about 5 nm. A thickness of each of the source electrode 813 and the drain electrode 814 may be about 55 nm.

Referring to FIG. 8A, FIG. 8B, and FIG. 9, in the semiconductor device 100, the insulating layer 202 may be positioned between the fin channel member 304 (or first channel member 304) and the semiconductor substrate 201 and may overlap the gate electrode 509. The fin channel member 304 may be positioned between the gate electrode 509 and the insulating layer 202. The overlying channel member 606 (or second channel member 606) may be positioned between the gate electrode 509 and the fin channel member 304.

A semiconductor material of the overlying channel member 606 may be different from a semiconductor material of the fin channel member 304. Each of the overlying channel member 606 and the fin channel member 304 may have a single-layer structure or a multilayer structure. The overlying channel member 606 may include at least one of a transition metal dichalcogenide (TMD or TMDC) layer, a silylene layer, and a black phosphorus layer. The TMD layer may include at least one of an $MoS_2$ layer, an $MoSe_2$ layer, an $MoTe_2$ layer, a $WS_2$ layer, a $WSe_2$ layer, a $WTe_2$ layer, etc. The fin channel member 304 may include at least one of a crystal-like Ge layer (or substantially monocrystalline Ge layer) and a crystal-like Si layer (or substantially monocrystalline Si layer).

A minimum thickness of the overlying channel member 606 may be less than a minimum thickness of the fin channel member 304. A minimum thickness of the overlying channel member 606 may be in a range of 2 nm to 10 nm. A minimum thickness of the fin channel member 304 may be in a range of 5 nm to 50 nm. A thickness of the fin channel member 304 in a direction perpendicular to the insulating layer 202 may be in a range of 5 nm to 50 nm.

The overlying channel member 606 may include portions 6061, 6062, 6063, 6064, 6065, and 6066. The portion 6061 may be connected through the portion 6063 to the portion 6062. The portion 6063 may be oriented at an angle with respect to the portion 6061. The angle may be less than 180 degrees and may be greater than 0 degree. The angle may be greater than or equal to 90 degrees. The portion 6063 may extend substantially parallel to each of the portions 6064 and 6065. The fin channel member 304 may be positioned between the portion 6061 and the portion 6062. The gate electrode 509 may include sections 5091, 5092, and 5093. The portion 6061 may be positioned between the section 5091 and the fin channel member 304. The portion 6062 may be positioned between the section 5092 and the fin channel member 304. The portion 6063 may be positioned between the section 5093 and the fin channel member 304.

Referring to FIG. 8A and FIG. 9, a first portion of the oxide layer 607, e.g., a titanium dioxide ($TiO_2$) layer, may be positioned between the gate electrode 509 and the overlying channel member 606. The oxide layer 607 may directly contact three sides of the overlying channel member 606. The oxide layer 607 may directly contact five sides of the overlying channel member 606. The oxide layer 607 may directly contact three sides of the gate electrode 509. The oxide layer 607 may directly contact five sides of the gate electrode 509.

Referring to FIG. 8B and FIG. 9, a second portion of the oxide layer 607 may be positioned between the drain electrode 814 and the portion 6066 of the overlying channel member 606. The second portion of the oxide layer 607 may directly contact each of the drain electrode 814 and the portion 6066 of the overlying channel member 606.

Referring to FIG. 8A and FIG. 9, a first portion of the oxide layer 605, e.g., a titanium dioxide ($TiO_2$) layer, may be positioned between the fin channel member 304 and the overlying channel member 606. The oxide layer 605 may directly contact three sides of the overlying channel member 606. The oxide layer 605 may directly contact five sides of the overlying channel member 606. The oxide layer 605 may directly contact three sides of the fin channel member 304.

Referring to FIG. 8B and FIG. 9, a second portion of the oxide layer 605 may be positioned between the drain region 711 and the 6066 portion of the overlying channel member 606. The second portion of the oxide layer 605 may directly contact each of the drain region 711 and the portion 6066 of the overlying channel member 606. The portion 6066 of the overlying channel member 606 may be positioned between the drain region 711 and the drain electrode 814. The drain region 711 may be positioned between a portion 3041 of the fin channel member 304 and the portion 6066 of the overlying channel member 606. The portion 3041 of the fin channel member 304 may be positioned between the drain region 711 and the insulating layer 202 in the direction perpendicular to the insulating layer 202.

The fin channel member 304 may operate in an inversion mode. The semiconductor device 100 may be used for high-power applications.

Figure 10:
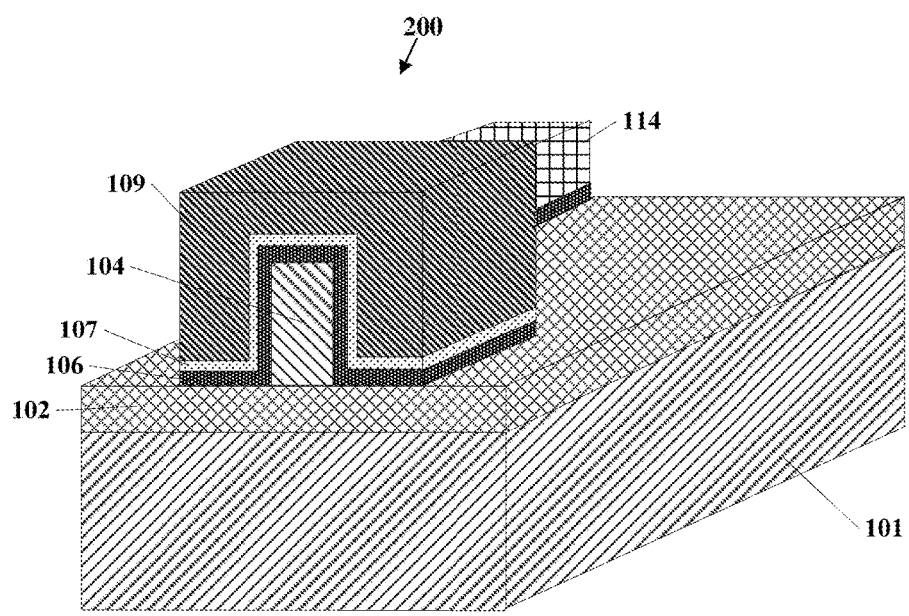
FIG. 10 shows a schematic diagram (e.g., a schematic perspective view) that illustrates elements and/or structures in a semiconductor device in accordance with one or more embodiments.

FIG. 10 shows a schematic diagram (e.g., a schematic perspective view) that illustrates elements and/or structures in a semiconductor device 200 in accordance with one or more embodiments. Some features, structures, and/or advantages of the semiconductor device 200 analogous to and/or identical to some features, structures, and/or advantages of the semiconductor device 100. The semiconductor device 200 may include a gate electrode 109, an oxide layer 107, an overlying channel member 106, a fin channel member 104, a drain electrode 114, an insulating layer 102, and a semiconductor substrate 101, which may have features, structures, and/or advantages analogous to and/or identical to one or more of the gate electrode 509, the oxide layer 607, the overlying channel member 606, the fin channel member 304, the drain electrode 814, the insulating layer 202, and the semiconductor substrate 201 of the semiconductor device 100.

In contrast to the semiconductor device 100, the semiconductor device 200 may not have an oxide layer between the overlying channel member 106 and the fin channel member 104. The overlying channel member 106 may directly contact the fin channel member 104. The overlying channel member 106 may directly contact three sides of the fin channel member 104. A side of the insulating layer 102 may directly contact both the fin channel member 104 and the overlying channel member 106.

In contrast to the semiconductor device 100, the semiconductor device 200 (and/or the fin channel member 104) may not have any source region or drain region analogous to the source region 710 and 711 of the semiconductor device 100. Therefore, the fabrication process of the semiconductor device 100 may be substantially simplified. The fin channel member 104 may operate in a junctionless mode. The semiconductor device 200 may enable satisfactory control over potential short-channel effects, may have a satisfactorily small channel dimension, and/or may enable efficient turn-off operations. The semiconductor device 200 may be suitable for low-power applications and/or low-leakage applications.

According to embodiments, an overlying channel member of a semiconductor device may be substantially thin. Therefore, short-channel effects and/or power dissipation in the semiconductor device may be minimized. According to embodiments, a size of a band gap associated with the overlying channel member may be tuned (or optimized), for example, by optimizing the number of layers in the overlying channel member and/or using a transverse electric field. Therefore, the switching efficiency of the semiconductor device (e.g., as a transistor) may be optimized. According to embodiments, an oxide layer may optimize one or more Schottky barriers between the overlying channel member and one or more of the source electrode, the drain electrode, and the gate electrode of the semiconductor device. Therefore, contact resistance in the semiconductor device may be optimized. Advantageously, the size of the semiconductor device may be minimized, and/or satisfactory performance of the semiconductor device may be attained.

An embodiment may be related to an electronic device. The electronic device may include an electronic component and the semiconductor device 100 or the semiconductor device 200, which may be electrically connected to the electronic component. The semiconductor device 100 or the semiconductor device 200 may have one or more of the above-discussed features.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A semiconductor device comprising:
a gate electrode, which comprises a first section, a second section, and third section, wherein the first section is connected through the third section to the second section, wherein the third section is oriented at a first angle with respect to the first section, wherein the third section is oriented at a second angle with respect to the second section, and wherein each of the first angle and the second angle is less than 180 degrees;
an insulating layer, which overlaps the gate electrode;
a first channel member, which is positioned between the gate electrode and the insulating layer; and
a second channel member, which comprises a first portion and a second portion, wherein the first portion is positioned between the first section and the first channel member, wherein the second portion is positioned between the second section and the first channel member, and wherein a semiconductor material of the second channel member is different from a semiconductor material of the first channel member.

2. The semiconductor device of claim 1, wherein the second channel member comprises at least one of a transition metal dichalcogenide layer, a silylene layer, and a black phosphorus layer.

3. The semiconductor device of claim 1, wherein a minimum thickness of the second channel member is less than a minimum thickness of the first channel member.

4. The semiconductor device of claim 1, wherein a minimum thickness of the second channel member is in a range of 2 nm to 10 nm.

5. The semiconductor device of claim 1, wherein the first channel member is positioned between the first portion and the second portion.

6. The semiconductor device of claim 1, wherein the second channel member comprises a third portion, which is is positioned between the third section and the first channel member.

7. The semiconductor device of claim 5, wherein the second channel member comprises a third portion, wherein the first portion is connected through the third portion to the second portion, wherein the third portion is oriented at an angle with respect to the first portion, and wherein the angle is less than 180 degrees and is greater than 0 degree.

8. The semiconductor device of claim 1 further comprising an oxide layer, wherein a first portion of the oxide layer is positioned between the gate electrode and the second channel member, and wherein the oxide layer directly contacts three sides of the second channel member.

9. The semiconductor device of claim 1 further comprising an oxide layer, wherein a first portion of the oxide layer is positioned between the first channel member and the second channel member.

10. The semiconductor device of claim 9, wherein the oxide layer directly contacts three sides of the second channel member.

11. The semiconductor device of claim 9, wherein the oxide layer directly contacts three sides of the first channel member.

12. The semiconductor device of claim 9 further comprising a doped drain region, wherein a second portion of the oxide layer is positioned between the doped drain region and a portion of the second channel member.

13. The semiconductor device of claim 1, wherein the second channel member directly contacts the first channel member.

14. The semiconductor device of claim 1, wherein the second channel member directly contacts three sides of the first channel member.

15. The semiconductor device of claim 1, wherein a side of the insulating layer directly contacts both the first channel member and the second channel member.

16. A semiconductor device comprising:
a gate electrode;
an insulating layer, which overlaps the gate electrode;
a first channel member, which is positioned between the gate electrode and the insulating layer;
a second channel member, which is positioned between the gate electrode and the first channel member, wherein a semiconductor material of the second channel member is different from a semiconductor material of the first channel member; and
an oxide layer, which directly contacts three flat sides of the first channel member or directly contacts three flat sides of the gate electrode.

17. A semiconductor device comprising:
a gate electrode;
an insulating layer, which overlaps the gate electrode;
a first channel member, which is positioned between the gate electrode and the insulating layer;
a second channel member, which is positioned between the gate electrode and the first channel member, wherein a semiconductor material of the second channel member is different from a semiconductor material of the first channel member;
an oxide layer, wherein a first portion of the oxide layer is positioned between the gate electrode and the second channel member; and
a drain electrode, wherein a second portion of the oxide layer is positioned between the drain electrode and a portion of the second channel member.

18. A semiconductor device comprising:
a gate electrode;
an insulating layer, which overlaps the gate electrode;
a first channel member, which is positioned between the gate electrode and the insulating layer;
a second channel member, which is positioned between the gate electrode and the first channel member, wherein a semiconductor material of the second channel member is different from a semiconductor material of the first channel member;
a doped drain region; and
a drain electrode, wherein a portion of the second channel member is positioned between the doped drain region and the drain electrode.

19. A semiconductor device comprising:
a gate electrode;
an insulating layer, which overlaps the gate electrode;
a first channel member, which is positioned between the gate electrode and the insulating layer;
a second channel member, which is positioned between the gate electrode and the first channel member, wherein a semiconductor material of the second channel member is different from a semiconductor material of the first channel member;
a doped drain region, wherein the doped drain region is positioned between a portion of the first channel member and a portion of the second channel member in a direction perpendicular to the insulating layer.

20. The semiconductor device of claim 19 further comprising a semiconductor substrate, wherein the insulating layer is positioned between the first channel member and the semiconductor substrate, and wherein the portion of the first channel member is positioned between the doped drain region and the insulating layer in the direction perpendicular to the insulating layer.

* * * * *